(12) United States Patent
Fan

(10) Patent No.: US 11,764,108 B2
(45) Date of Patent: Sep. 19, 2023

(54) METHOD FOR PREPARING SEMICONDUCTOR DIE STRUCTURE WITH AIR GAPS

(71) Applicant: NANYA TECHNOLOGY CORPORATION, New Taipei (TW)

(72) Inventor: Pei-Cheng Fan, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 89 days.

(21) Appl. No.: 17/517,539

(22) Filed: Nov. 2, 2021

(65) Prior Publication Data
US 2022/0059399 A1 Feb. 24, 2022

Related U.S. Application Data

(62) Division of application No. 16/855,601, filed on Apr. 22, 2020, now Pat. No. 11,270,908.

(51) Int. Cl.
*H01L 21/768* (2006.01)
*H01L 23/532* (2006.01)

(52) U.S. Cl.
CPC ...... *H01L 21/7682* (2013.01); *H01L 23/5329* (2013.01)

(58) Field of Classification Search
CPC . H01L 29/4991; H01L 21/7682; H01L 21/64; H01L 23/5329
See application file for complete search history.

(56) References Cited

U.S. PATENT DOCUMENTS

| 10,636,891 | B2 * | 4/2020 | Yang | H01L 29/66545 |
| 2004/0063305 | A1 * | 4/2004 | Kloster | H01L 21/7682 |
| | | | | 438/619 |
| 2009/0026505 | A1 * | 1/2009 | Okano | H01L 29/7843 |
| | | | | 257/E21.409 |
| 2021/0066489 | A1 * | 3/2021 | Xie | H01L 29/785 |
| 2021/0090959 | A1 * | 3/2021 | Min | H01L 21/7682 |
| 2021/0091179 | A1 * | 3/2021 | Wang | H01L 29/0847 |
| 2021/0210634 | A1 * | 7/2021 | Lee | H01L 29/0847 |

* cited by examiner

*Primary Examiner* — Jaehwan Oh
*Assistant Examiner* — John M Parker
(74) *Attorney, Agent, or Firm* — Xuan Zhang

(57) ABSTRACT

The present disclosure provides a method for preparing a semiconductor die structure with air gaps for reducing capacitive coupling between conductive features and a method for preparing the semiconductor die structure. The method includes: forming a first supporting backbone on the substrate; forming a first conductor block on the first supporting backbone; forming a second supporting backbone on the substrate; forming a second conductor block on the second supporting backbone; forming a third conductor block suspended above the substrate and connected to the first conductor block and the second conductor block; sequentially forming an energy removable layer and a capping dielectric layer over the substrate, and the energy removable layer and the capping dielectric layer separating the first conductor block, the second conductor block and the third conductor block; and performing a heat treatment process to transform the energy removable layer into a plurality of air gap structures.

6 Claims, 20 Drawing Sheets

US 11,764,108 B2

METHOD FOR PREPARING SEMICONDUCTOR DIE STRUCTURE WITH AIR GAPS

CROSS-REFERENCE TO RELATED APPLICATION

This application is a divisional application of U.S. application Ser. No. 16/855,601 filed Apr. 22, 2020, which is incorporated herein by reference in its entirety.

TECHNICAL FIELD

The present disclosure relates to a method for preparing semiconductor die structure, and more particularly, to method for preparing semiconductor die structure with air gaps for reducing capacitive coupling between conductive features and a method for preparing the same.

DISCUSSION OF THE BACKGROUND

Semiconductor dies are widely used in electronics industries. Semiconductor dies may have relatively small sizes, multi-functional characteristics, and/or relatively low manufacture costs. Semiconductor dies may be categorized as any one of semiconductor memory dies storing logical data, semiconductor logic dies processing logical data, and hybrid semiconductor dies having both the function of the semiconductor memory dies and the function of the semiconductor logic dies.

Relatively high-speed and relatively low-voltage semiconductor dies may satisfy desired characteristics (e.g., high speed and/or low power consumption) of electronic dies including semiconductor dies. Semiconductor dies may be relatively highly integrated. Reliability of semiconductor dies may be reduced by relatively high integration density of the semiconductor dies.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor die structure, comprising: a substrate; a first supporting backbone disposed on the substrate; a second supporting backbone disposed on the substrate; a first conductor block disposed on the first supporting backbone; a second conductor block disposed on the second supporting backbone; a third conductor block disposed above the substrate and connected to the first conductor block and the second conductor block; and an air gap structure disposed between the first conductor block, the second conductor block, and the third conductor block, wherein the air gap structure comprises an air gap and a liner layer enclosing the air gap.

In some embodiments, the semiconductor die structure further comprises a first metal cap disposed on the first conductor block and a second metal cap disposed on the second conductor block.

In some embodiments, the first metal cap and the second metal cap comprise a metal silicide.

In some embodiments, the metal silicide comprises cobalt (Co), copper (Cu), ruthenium (Ru), cobalt monosilicide (CoSi), or nickel mono-silicide (NiSi).

In some embodiments, the third conductor block is suspended over the air gap structure.

In some embodiments, the first conductor block and the second conductor block are separated by the air gap structure.

In some embodiments, the first supporting backbone and the second supporting backbone are separated by the air gap structure.

In some embodiments, the first supporting backbone and the second supporting backbone comprise a tungsten oxide, a hafnium oxide, a zirconium oxide, silicon mononitride (SiN), silicon carbide (SiC), silicon carbonitride (SiCN).

Another aspect of the present disclosure provides a semiconductor die structure, comprising: a substrate including a first site and a second site; a first conductor block disposed on the first site; a second conductor block disposed on the second site; a third conductor block disposed above the substrate and connected to the first conductor block and the second conductor block; an air gap structure disposed between the first conductor block, the second conductor block, and the third conductor block, wherein the air gap structure comprises an air gap and a liner layer enclosing the air gap.

In some embodiments, the semiconductor die structure further comprises a first metal cap disposed on the first conductor block and a second metal cap disposed on the second conductor block.

In some embodiments, the first metal cap and the second metal cap comprise a metal silicide.

In some embodiments, the metal silicide comprises cobalt (Co), copper (Cu), ruthenium (Ru), cobalt monosilicide (CoSi), or nickel mono-silicide (NiSi).

In some embodiments, the third conductor block is suspended over the air gap structure.

In some embodiments, the first conductor block and the second conductor block are separated by the air gap structure.

Another aspect of the present disclosure provides a method for preparing a semiconductor die structure, comprising: forming a first supporting backbone on the substrate; forming a first conductor block on the first supporting backbone; forming a second supporting backbone on the substrate; forming a second conductor block on the second supporting backbone; forming a third conductor block suspended above the substrate and connected to the first conductor block and the second conductor block; sequentially forming an energy removable layer and a capping dielectric layer over the substrate, and the energy removable layer and the capping dielectric layer separating the first conductor block, the second conductor block and the third conductor block; and performing a heat treatment process to transform the energy removable layer into a plurality of air gap structures, wherein at least one of the air gap structures comprises an air gap and a liner layer enclosing the air gap.

In some embodiments, the forming of the first supporting backbone on the substrate comprises: forming a plurality of silicon-containing lines on the substrate; depositing a spacer layer on the substrate and the plurality of silicon-containing lines; and removing a first portion of the spacer layer to expose a first portion of the substrate between the plurality of polysilicon lines.

In some embodiments, the forming of the first conductor block on the first supporting backbone comprises forming a metal capped with a first hard mask between the plurality of silicon-containing lines.

In some embodiments, the forming of the second supporting backbone comprises: removing the plurality of polysilicon lines; forming the spacer layer on the substrate; and removing a second portion of the spacer layer to expose a second portion of the substrate.

In some embodiments, the forming of the second conductor block on the second supporting backbone comprises forming the metal capped with a second hard mask.

In some embodiments, the forming of the third conductor block above the substrate further comprises removing the spacer layer.

Embodiments of the semiconductor die structure are provided in the disclosure. The semiconductor die structure includes a plurality of air gaps, and the conductor blocks are separated from the each other by the air gaps. Therefore, the parasitic capacitance between the conductive contacts may be reduced. As a result, the overall device performance may be improved (i.e., the decreased power consumption and resistive-capacitive (RC) delay), and the yield rate of the semiconductor device may be increased.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
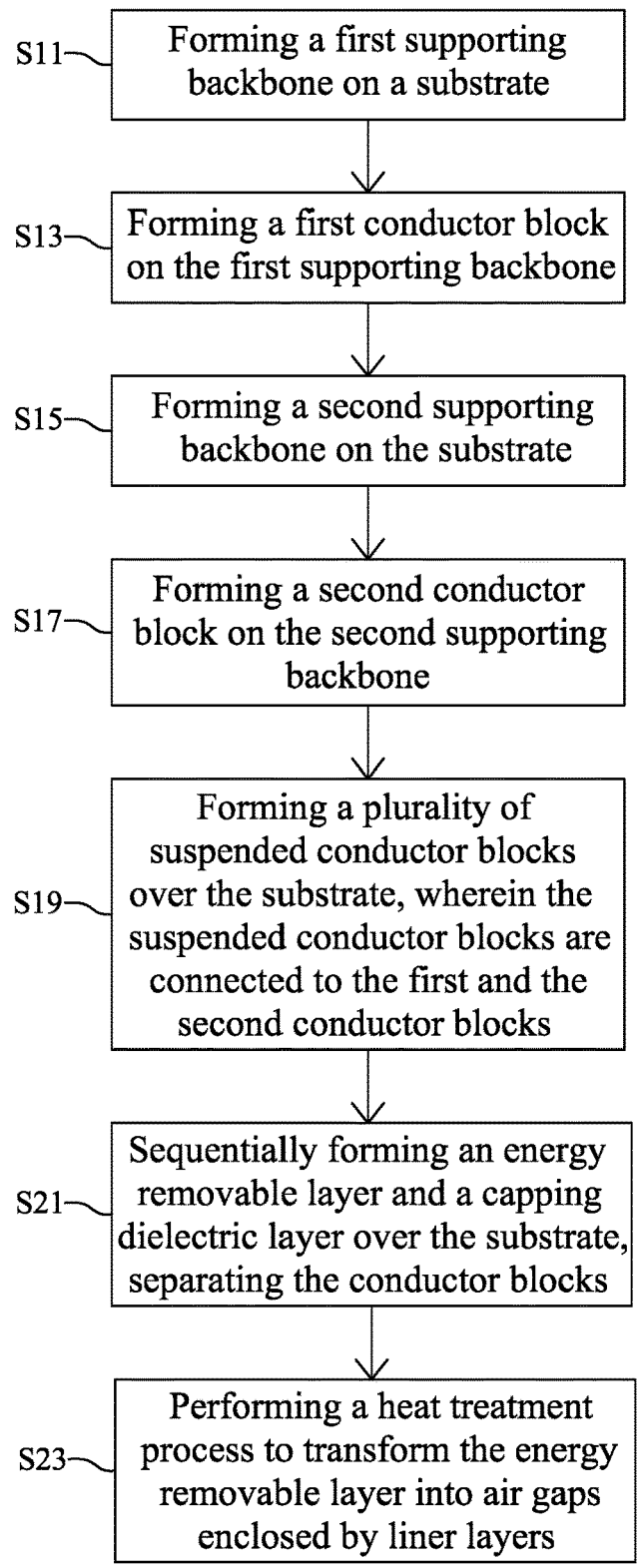
FIG. 1 illustrates a method for fabricating a semiconductor structure with air gaps for reducing capacitive coupling between conductive features such as lines and wires according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the die in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layers, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor die generally means a die which can function by utilizing semiconductor characteristics, and an electro-optic die, a light-emitting display die, a semiconductor circuit, and an electronic die are all included in the category of the semiconductor die.

It should be noted that, in the description of the present disclosure, above (or up) corresponds to the direction of the arrow of the direction Z, and below (or down) corresponds to the opposite direction of the arrow of the direction Z.

FIG. 1 illustrates a method 10 for fabricating a semiconductor structure with air gaps for reducing capacitive coupling between conductive features such as lines and wires according to some embodiments of the present disclosure.

The method 10 may be performed as operations. It may be noted that the method 10 may be performed in any order and may include the same, more, or fewer operations. It may be noted that the method 10 may be performed by one or more pieces of semiconductor fabrication equipment or fabrication tools. In some embodiments, the method 10 includes steps S11, S13, S15, S17, S19, S21 and S23. The steps S11 to S23 of FIG. 1 are elaborated in connection with following figures.

In some embodiments, referring to FIGS. 2-5, at the step S11 in the method 10 shown in FIG. 1, fabrication processes are performed to form a first supporting backbone 111 on a substrate 101.

In some embodiments, the substrate 101 may be a semiconductor wafer such as a silicon wafer. Alternatively or additionally, the substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the substrate 101 includes an epitaxial layer. For example, the substrate 101 has an epitaxial layer overlying a bulk semiconductor. In some embodiments, the substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

In some embodiments, the substrate 101 may be a variety of materials, including, but not limited to, sapphire, silicon, gallium nitride (GaN), germanium, or silicon carbide. The substrate 101 may be silicon on insulator (SOI). In some embodiments of the present disclosure, the substrate 101 is silicon. crystallographic orientation of a substantially monocrystalline substrate 101 may be any of (100), (111), or (110) on the Miller Indices. Other crystallographic orientations are also possible. The crystallographic orientations of substrate 101 may be offcut. In some embodiments of the present disclosure, the substrate 101 is (100) silicon with crystalline substrate surface region having cubic crystallinity. In another embodiment, for a (100) silicon substrate 101, the semiconductor surface may be miscut, or offcut, for example 2-10 degree. toward (110). In another embodiment, substrate 101 is (111) silicon with crystalline substrate surface region having hexagonal crystallinity.

Figure 2:
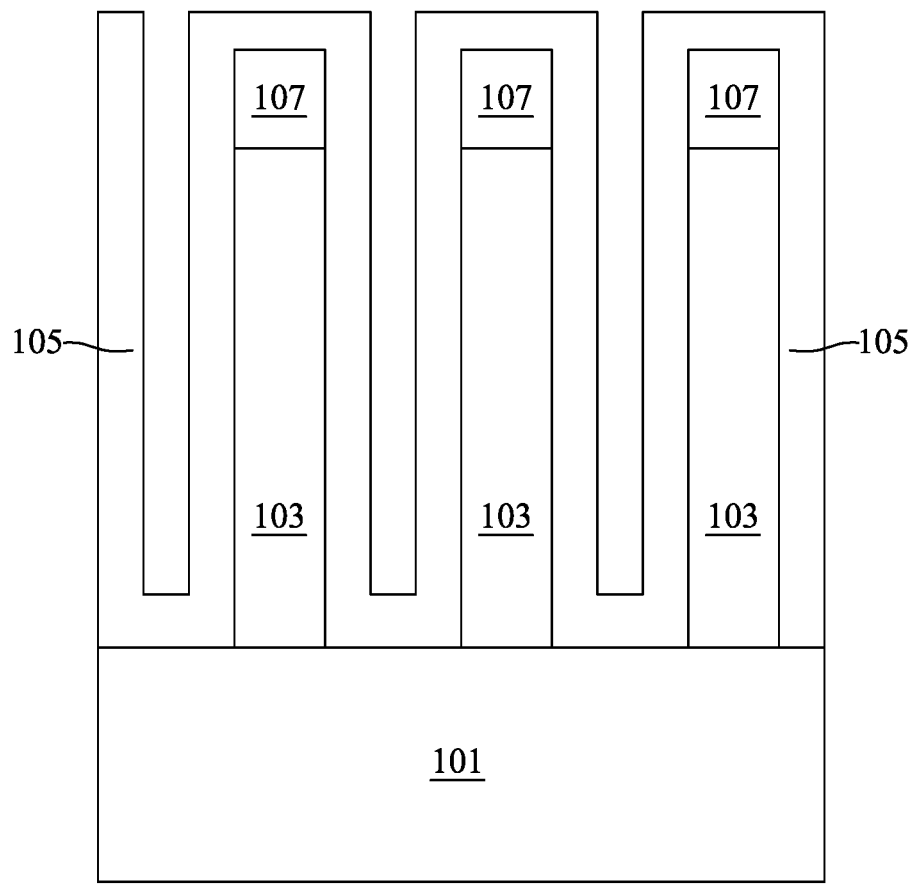
FIG. 2 is cross-sectional views illustrating an intermediate stage in the formation of the semiconductor die structure, in accordance with some embodiments of the present disclosure.

FIG. 2 is cross-sectional views illustrating an intermediate stage in the formation of the semiconductor die structure 100, in accordance with some embodiments of the present disclosure. In some embodiments, a plurality of silicon-containing lines 103 such as polysilicon lines may be disposed or grown over the substrate 101. The silicon-containing lines 103 may include a pattern at twice the final pitch (e.g., pitch is the width of a metal line plus the spacing between two metal lines) and capped with a hard mask 107. The hard mask 107 may include SiN. The silicon-containing lines 103 may be patterned on SiN, SiC, or alumina. A spacer layer 105 (e.g., silicon oxide) may be fabricated on the silicon-containing lines 103. It may be noted that a buffer layer (not shown) may be disposed between the silicon-containing lines 103 and substrate 101. An appropriate buffer layer may be disposed corresponding to the material type of substrate 101.

Figure 3:
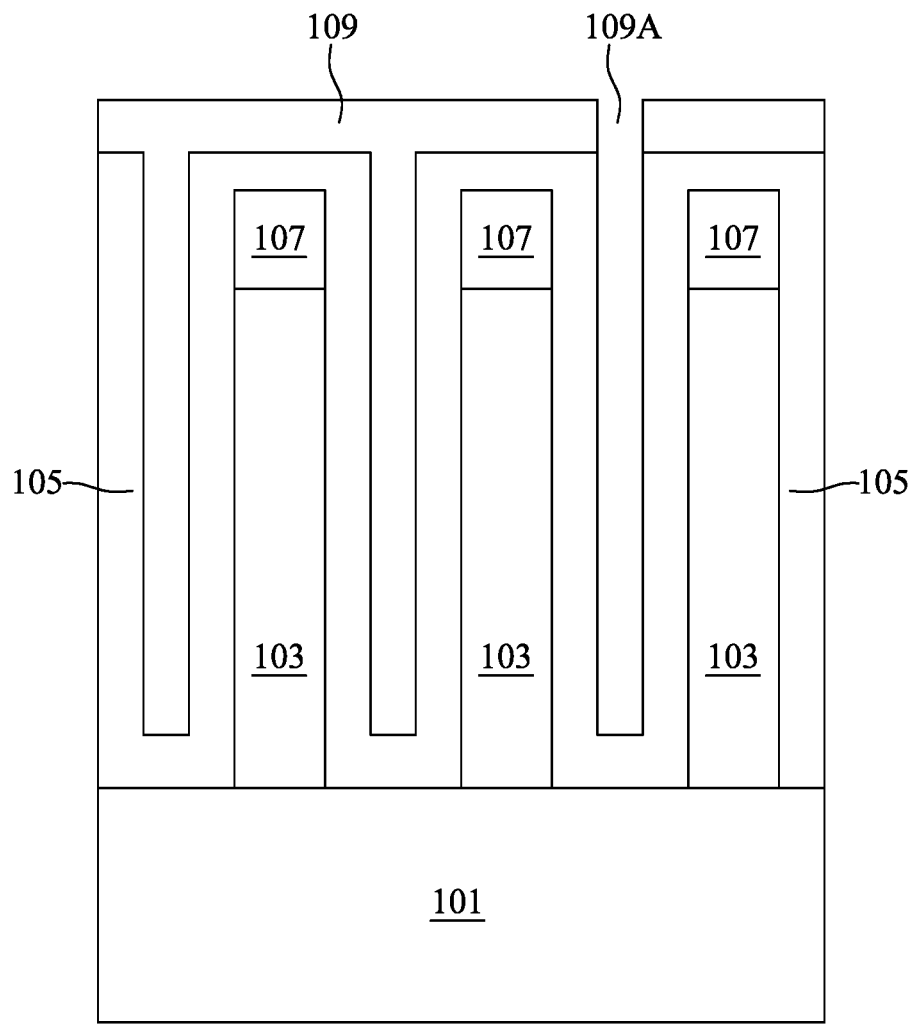
FIG. 3 is a cross-sectional view illustrating an intermediate stage of forming a carbon hard mask in the formation of the semiconductor die structure, in accordance with some embodiments of the present disclosure.

FIG. 3 is a cross-sectional view illustrating an intermediate stage of forming a carbon hard mask 109 in the formation of the semiconductor die structure 100, in accordance with some embodiments of the present disclosure. In some embodiments, the carbon hard mask 109 is formed on the spacer layer 105 by the deposition process, and a mask opening 109A is then formed in the carbon hard mask 109 by lithographically patterning.

Figure 4:
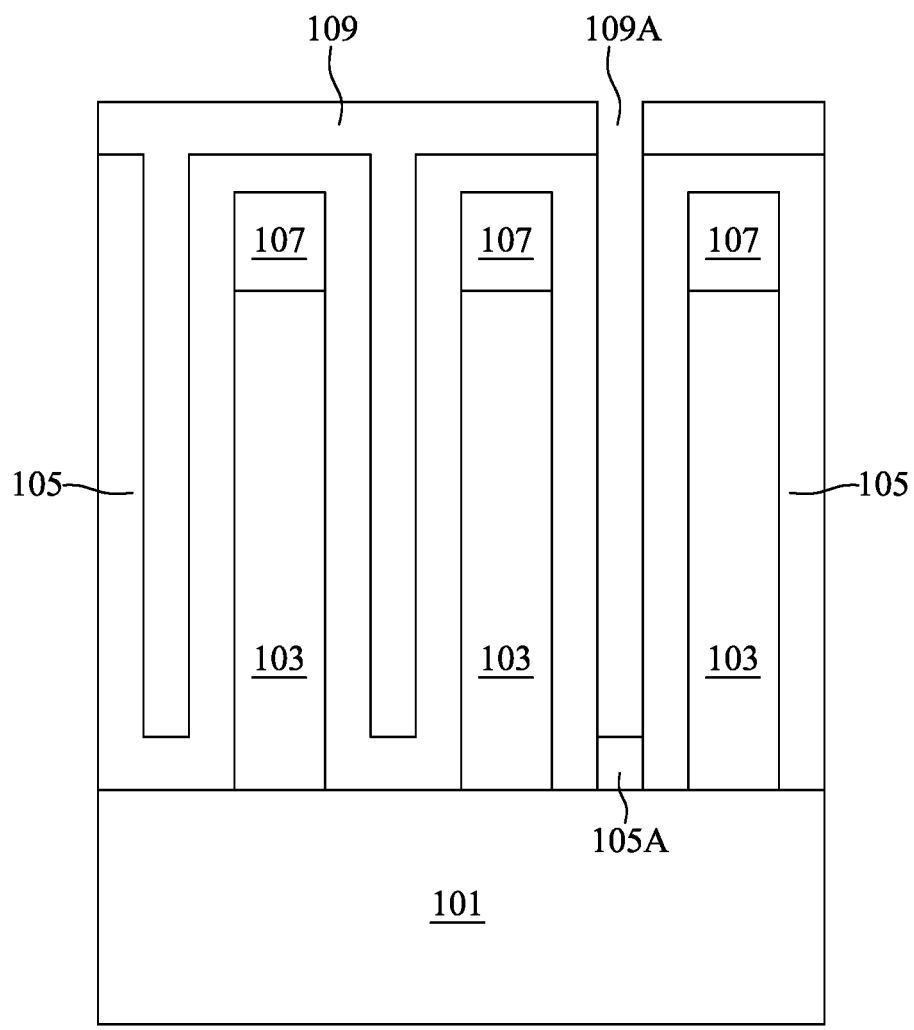
FIG. 4 is a cross-sectional view illustrating an intermediate stage of forming a spacer opening in the formation of the semiconductor die structure, in accordance with some embodiments.

FIG. 4 is a cross-sectional view illustrating an intermediate stage of forming a spacer opening 105A in the formation of the semiconductor die structure 100, in accordance with some embodiments. In some embodiments, an etching process is performed to transfer the mask opening 109A into the spacer opening 105A of the spacer layer 105.

Figure 5:
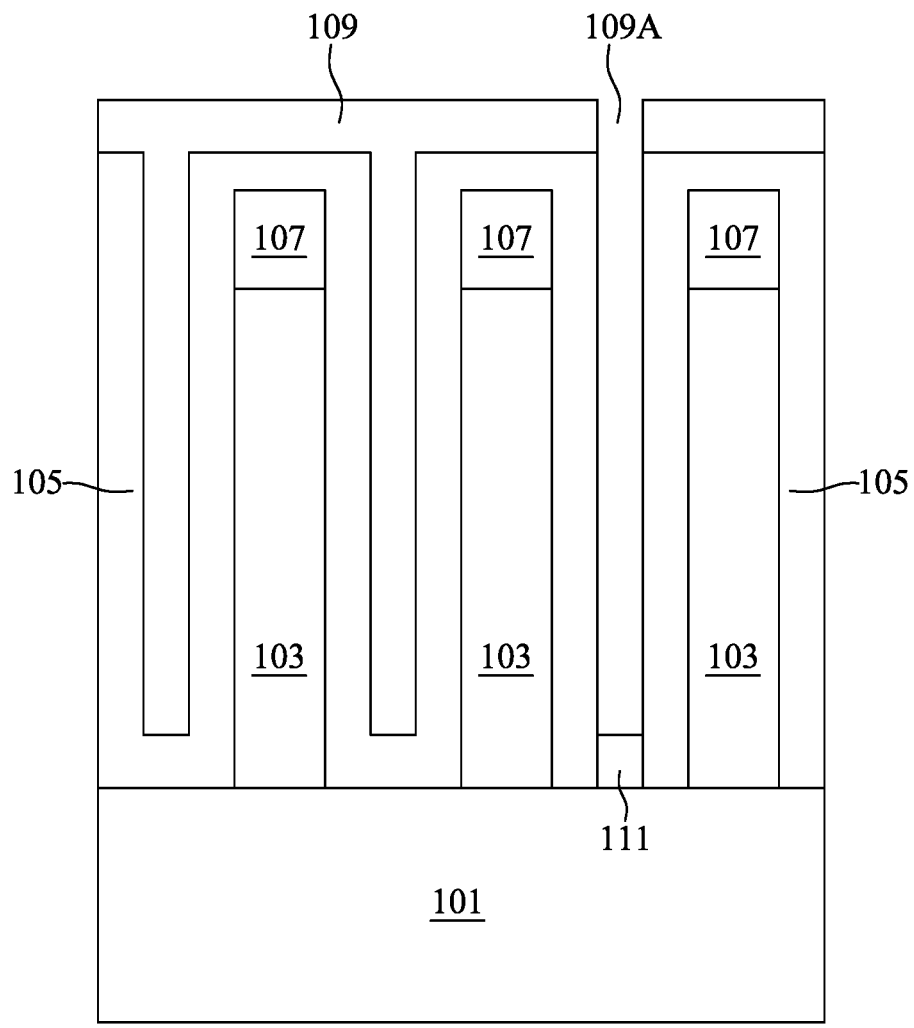
FIG. 5 is a cross-sectional view illustrating an intermediate stage of forming the supporting backbone in the formation of the semiconductor die structure, in accordance with some embodiments of the present disclosure.

FIG. 5 is a cross-sectional view illustrating an intermediate stage of forming the supporting backbone 111 in the formation of the semiconductor die structure 100, in accordance with some embodiments of the present disclosure. In some embodiments, the supporting backbone 111 may be fabricated by using a spin-on technique. The material of the supporting backbone 111 can be a spin-on metallic oxide (tungsten oxide, hafnium oxide, or zirconium oxide) that is deposited only up to a threshold height. The supporting backbone 111 may be a spin-on dielectric that has Si—C—Si (e.g., not Si—O—Si) in the backbone and that is properly cured to withstand hydrofluoric (HF) acid. In another embodiment, a non-conformal SiN, SiC, or SiCN may be used (e.g., instead of a spin-on) which may leave a thin etch top layer on the oxide spacer and may help protect the metal barrier from the HF strip during the subsequent air gap formation.

Figure 6:
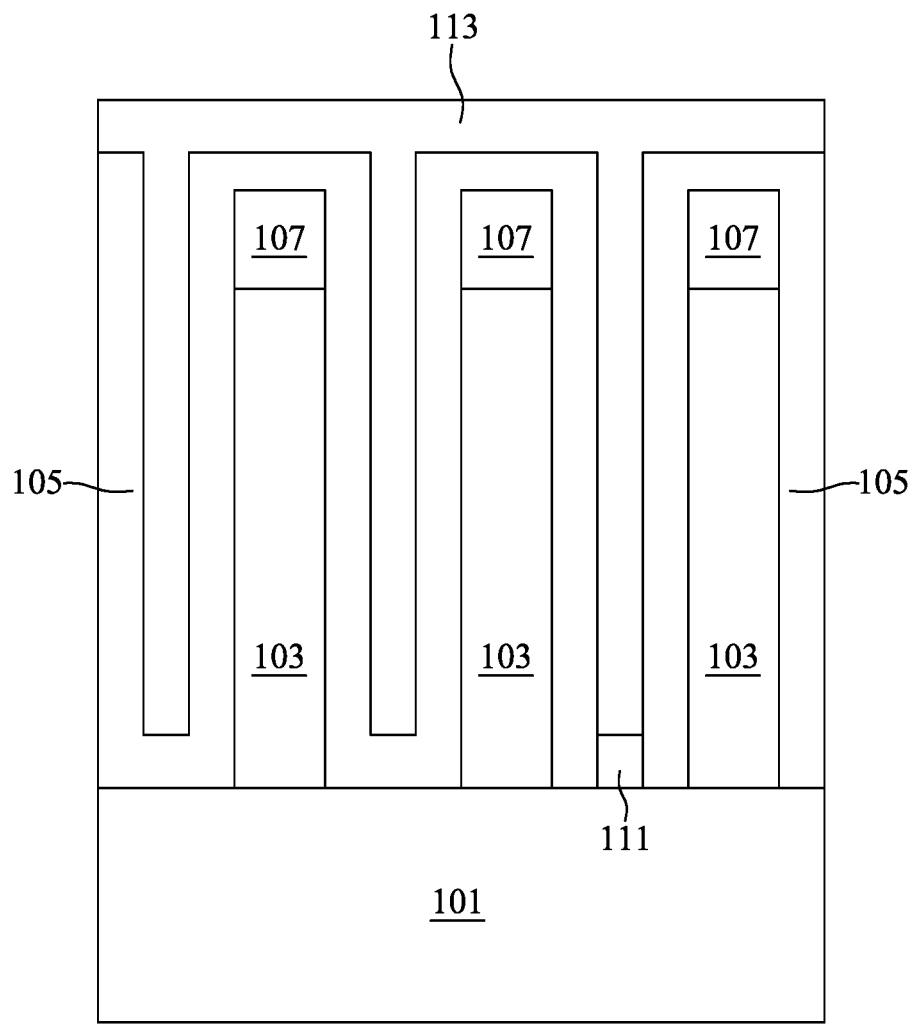
FIG. 6 is a cross-sectional view illustrating an intermediate stage of forming a conductor block in the formation of the semiconductor die structure, in accordance with some embodiments of the present disclosure.

FIG. 6 is a cross-sectional view illustrating an intermediate stage of forming a conductor block 113 in the formation of the semiconductor die structure 100, in accordance with some embodiments of the present disclosure. In some embodiments, the carbon hard mask 109 is removed (e.g., the carbon hard mask 109 is ashed away) and the conductor block 113 fills the regions between the spacer layer 105. The conductor block 113 may be a recessable material such as cobalt (Co), copper (Cu), ruthenium (Ru), or amorphous silicon (a-Si) (e.g., a-Si which is silicided later to form CoSi or NiSi).

Figure 7:
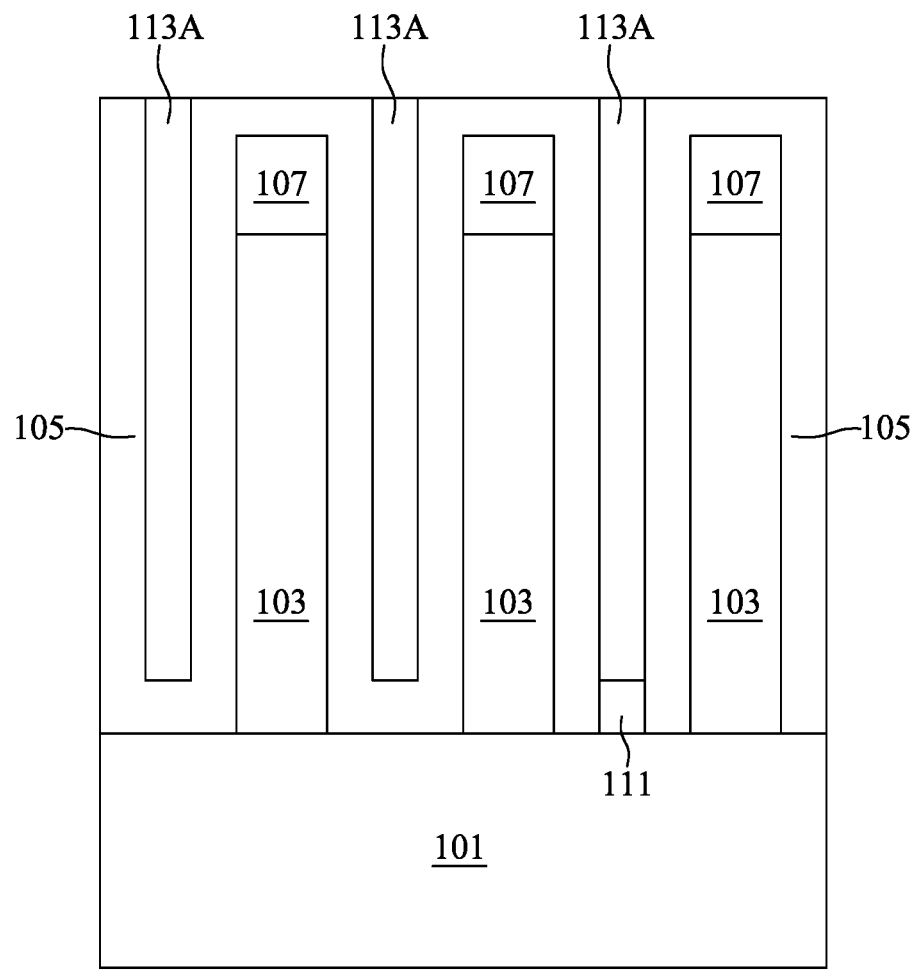
FIG. 7 is a cross-sectional view illustrating an intermediate stage of performing a planarization process in the formation of the semiconductor die structure, in accordance with some embodiments of the present disclosure.

FIG. 7 is a cross-sectional view illustrating an intermediate stage of performing a planarization process in the formation of the semiconductor die structure 100, in accordance with some embodiments of the present disclosure. At the step S13 in the method 10 shown in FIG. 1, a first conductor block is formed on the first supporting backbone. In some embodiments, a planarization process such as a chemical mechanical polishing (CMP) process is performed to remove a portion of the metal layer 113, such that the spacer layer 105 is exposed. In some embodiments, after the planarization process, a plurality of conductor blocks 113A are embedded in the spacer layer 105, wherein the top ends of the conductor blocks 113A are substantially the same as that of the spacer layer 105.

Figure 8:
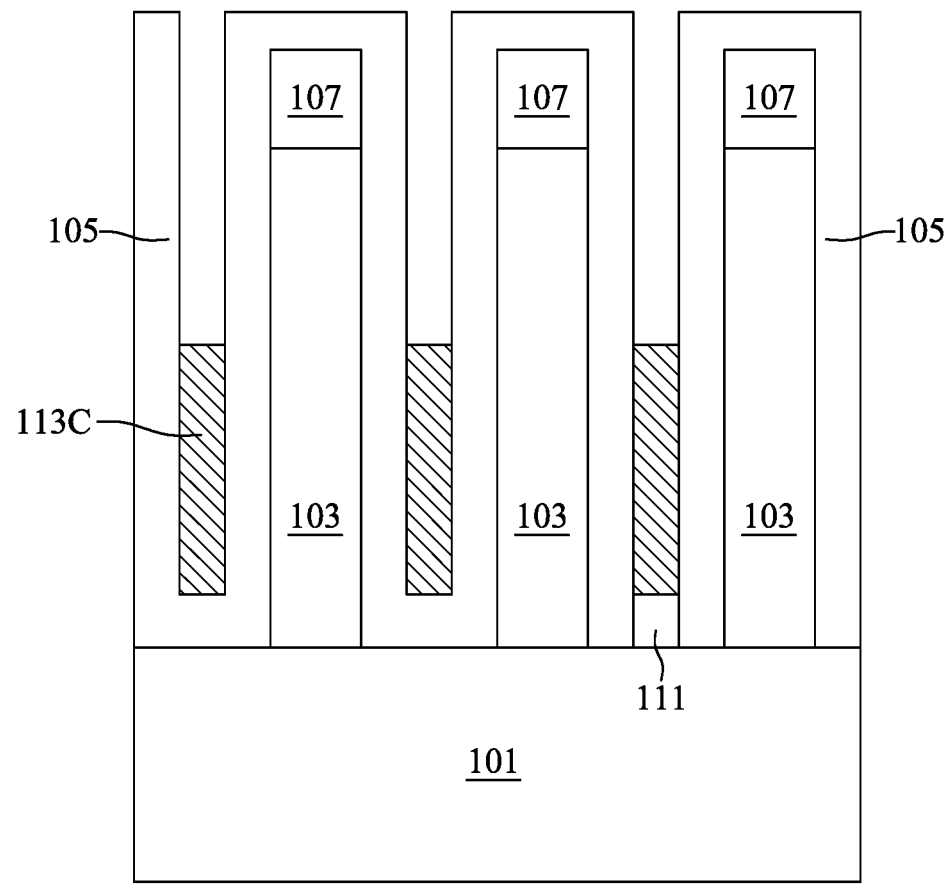
FIG. 8 is a cross-sectional view illustrating an intermediate stage of performing a recessing process in the formation of the semiconductor die structure, in accordance with some embodiments of the present disclosure.

FIG. 8 is a cross-sectional view illustrating an intermediate stage of performing a recessing process in the formation of the semiconductor die structure 100, in accordance with some embodiments of the present disclosure. In some embodiments, a portion of the conductor blocks 113A is removed by a recessing process such as an etching back process to form a plurality of conductor blocks 113B embedded in the spacer layer 105, wherein the top ends of the conductor blocks 113B are lower than that of the spacer layer 105.

Figure 9:
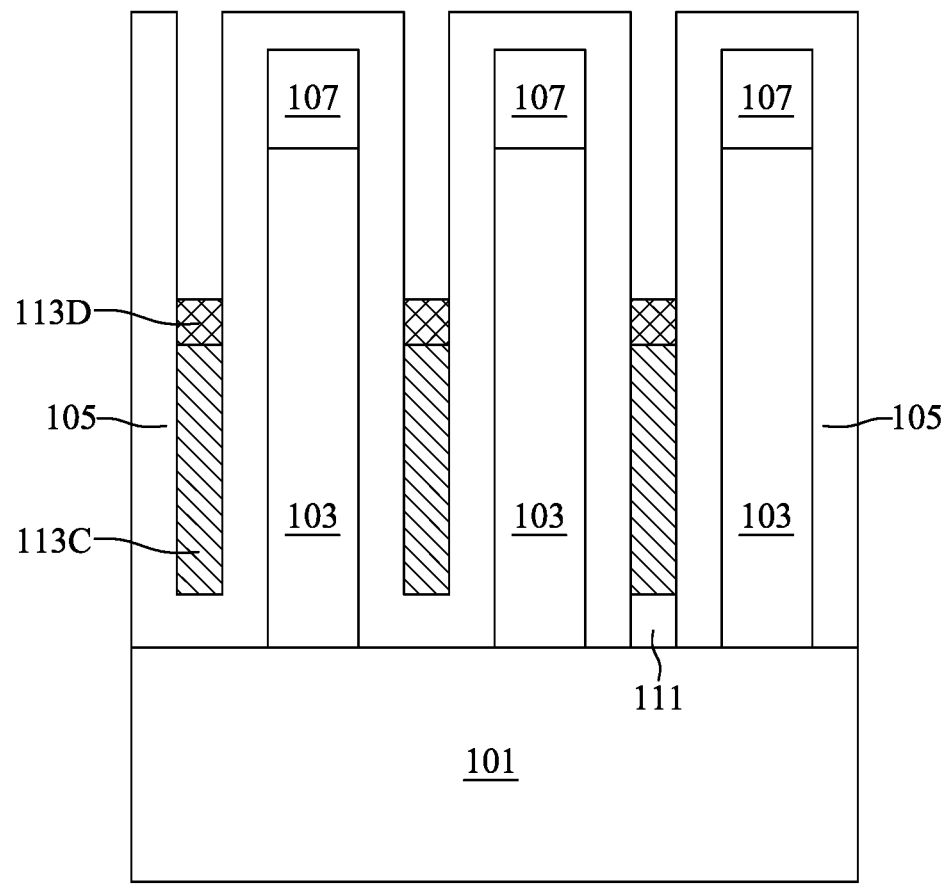
FIG. 9 is a cross-sectional view illustrating an intermediate stage of forming a metal silicide layer in the formation of the semiconductor die structure, in accordance with some embodiments of the present disclosure.

FIG. 9 is a cross-sectional view illustrating an intermediate stage of forming a metal silicide layer 113D in the formation of the semiconductor die structure 100, in accordance with some embodiments of the present disclosure. In some embodiments, when the conductor block 113C is a-Si, metal may be deposited on the conductor block 113C and annealed to form the metal silicide layer 113D over the conductor block 113C. In some embodiments, metal nickel (Ni) may be deposited and annealed to form nickel silicide (NiSi) or metal cobalt (Co) may be deposited and annealed to form cobalt silicide (CoSi).

Figure 10:
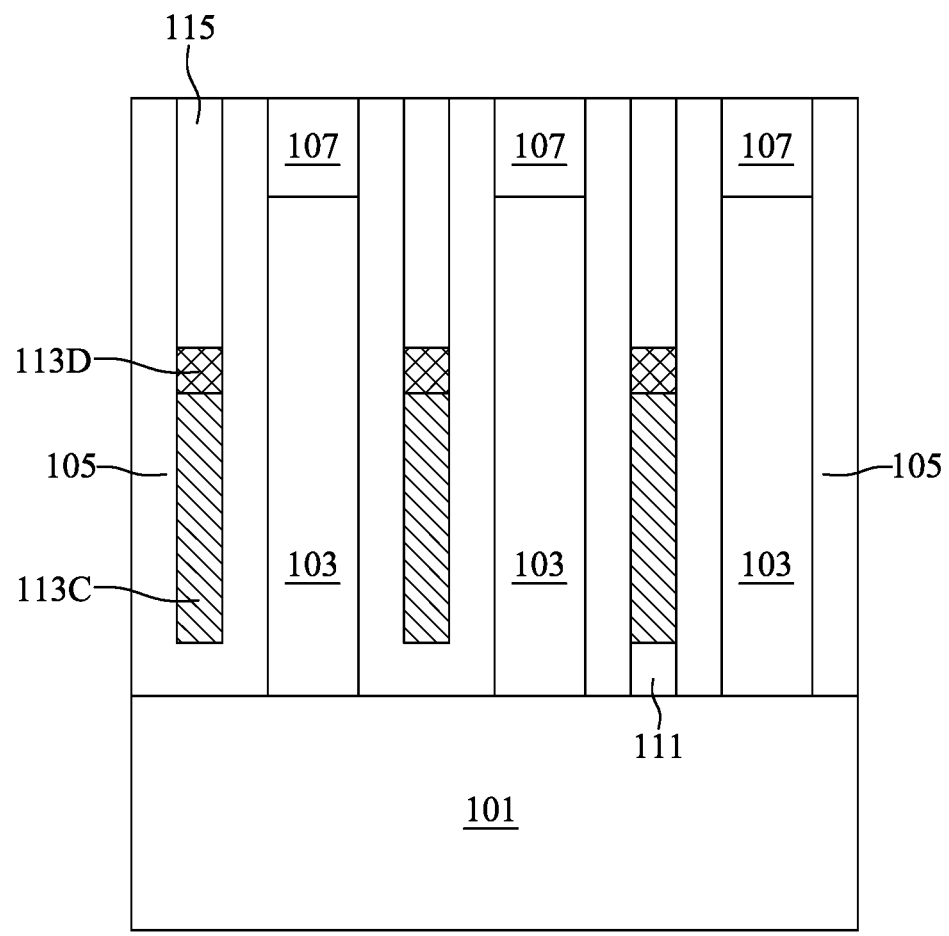
FIG. 10 is a cross-sectional view illustrating an intermediate stage of forming a first hard mask in the formation of the semiconductor die structure, in accordance with some embodiments of the present disclosure.

FIG. 10 is a cross-sectional view illustrating an intermediate stage of forming a first hard mask 115 in the formation of the semiconductor die structure 100, in accordance with some embodiments of the present disclosure. In some embodiments, a deposition process is performed to form the first hard mask 115 over the metal silicide layer 113D and a planarization process is then performed on the first hard mask 115. In some embodiments, the first hard mask 115 may include SiC, SiOC, ZrO2, HfO2, or W oxide. In some embodiments, the first hard mask 115 may be one or more of a dielectric, a carbide, or a metallic carbide. After forming the first hard mask layer 115, the conductor block 113C and the metal silicide layer 113D capped with the first hard mask 115 may be referred to as a metal line or a wire.

Figure 11:
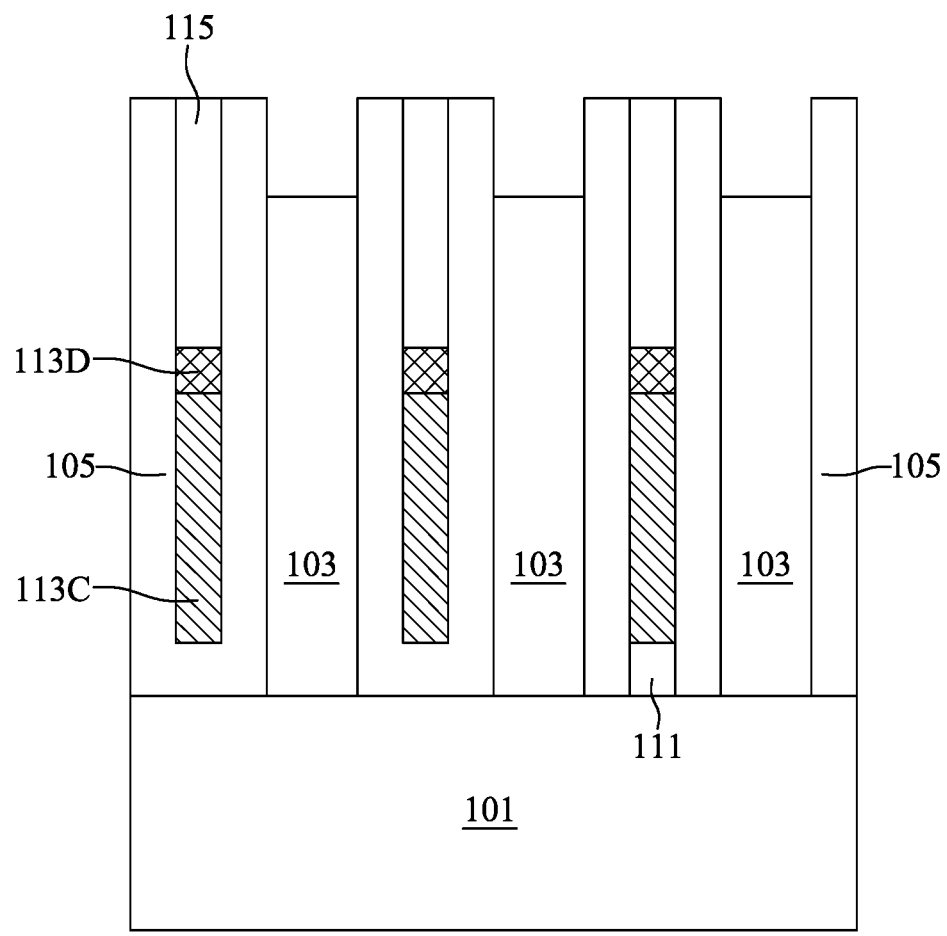
FIG. 11 is a cross-sectional view illustrating an intermediate stage of performing an etching process in the formation of the semiconductor die structure, in accordance with some embodiments of the present disclosure.

FIG. 11 is a cross-sectional view illustrating an intermediate stage of performing an etching process in the formation of the semiconductor die structure 100, in accordance with some embodiments of the present disclosure. In some embodiments, the hard mask 107 is removed to expose the silicon-containing lines 103 by an etching process such as a dry etching process to selectively remove the hard mask 107, while remaining the silicon-containing lines 103 on the substrate 101.

Figure 12:
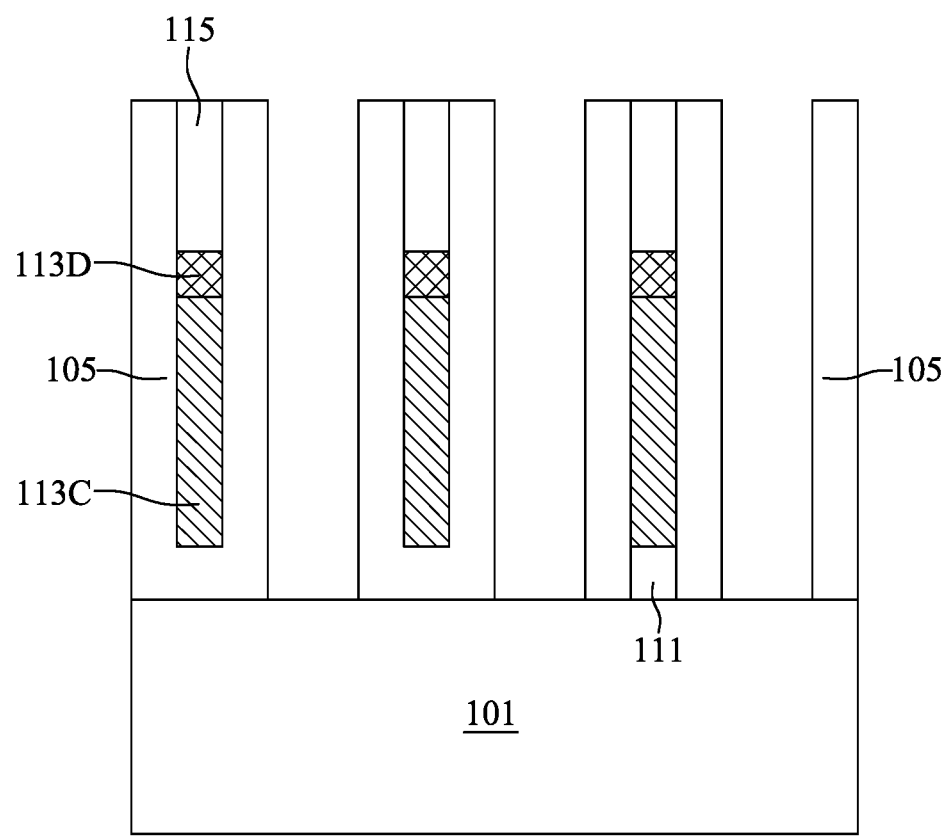
FIG. 12 is a cross-sectional view illustrating an intermediate stage of performing an etching process in the formation of the semiconductor die structure, in accordance with some embodiments of the present disclosure.

FIG. 12 is a cross-sectional view illustrating an intermediate stage of performing an etching process in the formation of the semiconductor die structure 100, in accordance with some embodiments of the present disclosure. In some embodiments, the silicon-containing lines 103 are etching out to expose portions of the substrate 101, while remaining the spacer layer 105 on the substrate 101.

Figure 13:
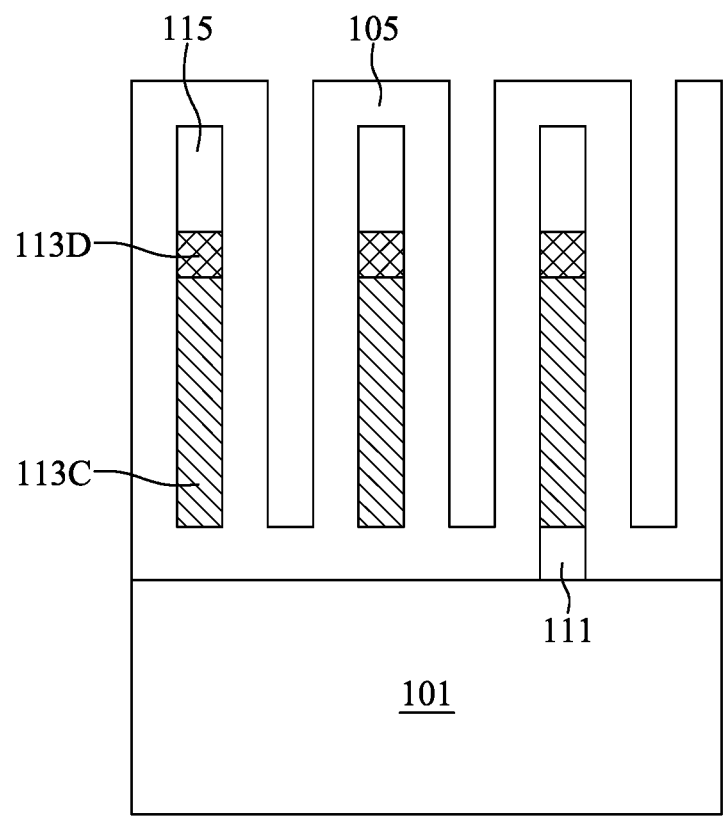
FIG. 13 is a cross-sectional view illustrating an intermediate stage of performing a deposition process in the formation of the semiconductor die structure, in accordance with some embodiments of the present disclosure.

FIG. 13 is a cross-sectional view illustrating an intermediate stage of performing a deposition process in the formation of the semiconductor die structure 100, in accordance with some embodiments of the present disclosure. In some embodiments, the deposition process is performed to deposit material of the spacer layer 105 on at least the exposed portions of the substrate 101 and the first hard mask 115.

Figure 14:
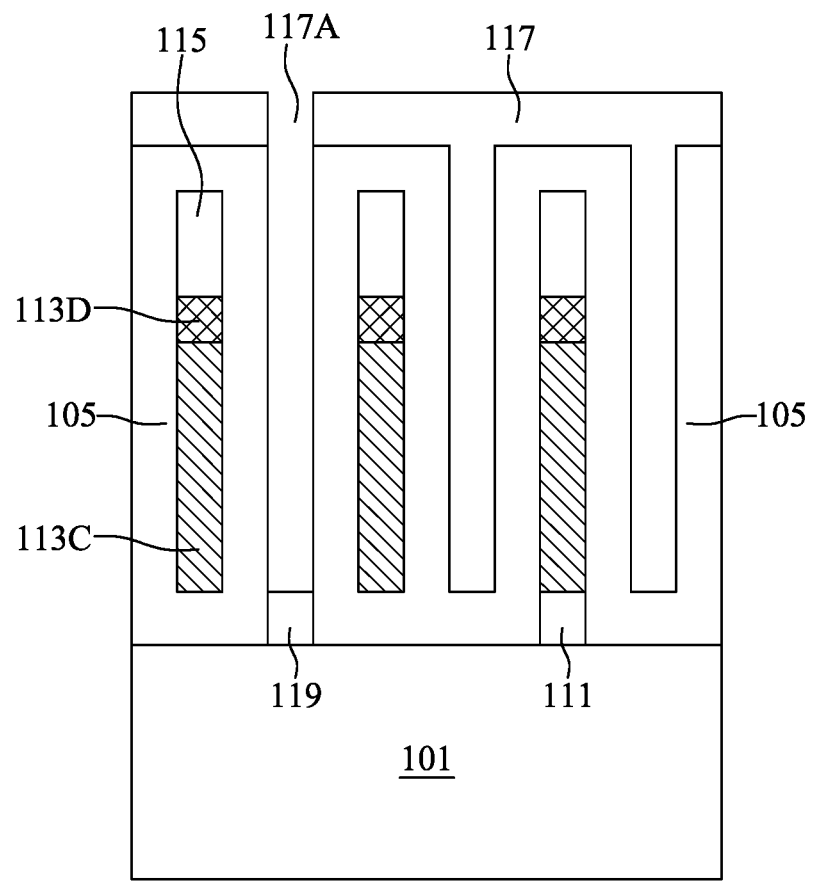
FIG. 14 is a cross-sectional view illustrating an intermediate stage of forming a second supporting backbone in the formation of the semiconductor die structure, in accordance with some embodiments of the present disclosure.

FIG. 14 is a cross-sectional view illustrating an intermediate stage of forming a second supporting backbone in the formation of the semiconductor die structure 100, in accordance with some embodiments of the present disclosure. At the step S15 in the method 10 shown in FIG. 1, a second supporting backbone 119 is formed on the substrate 101. In some embodiments, similar to the fabrication processes described in FIGS. 3-5, a carbon hard mask 117 is formed on the spacer layer 105 by the deposition process, and a mask opening 117A is then formed in the carbon hard mask 117 by lithographically patterning. In some embodiments, an etching process is performed to transfer the mask opening 117A into a spacer opening of the spacer layer 105 to expose a portion of the substrate 101. Subsequently, the supporting backbone 119 is then formed on the exposed portion of the substrate 101.

Figure 15:
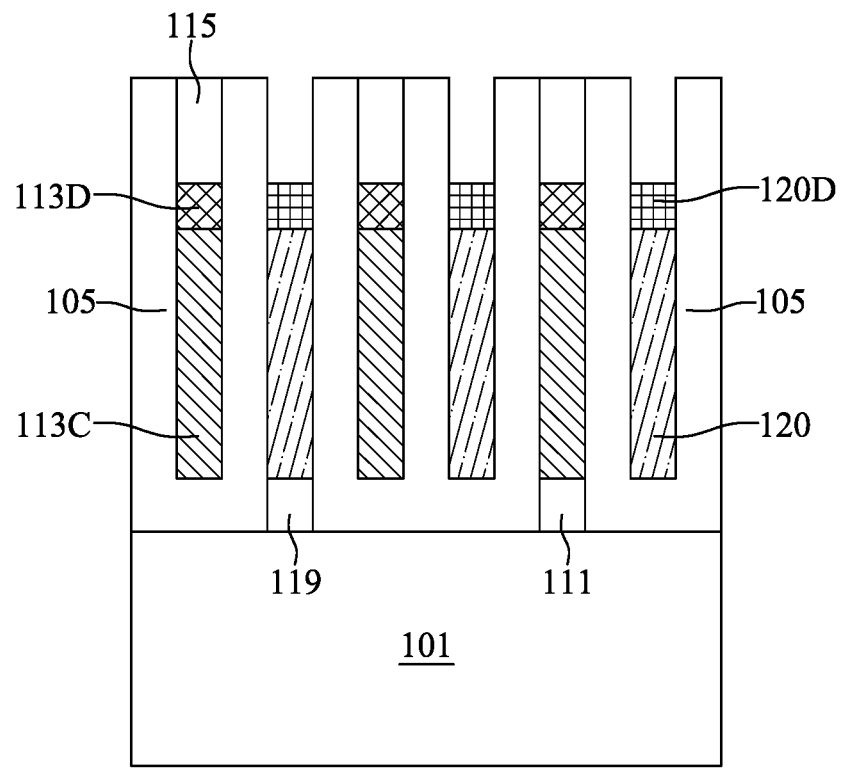
FIG. 15 is a cross-sectional view illustrating an intermediate stage of forming a conductor block in the formation of the semiconductor die structure, in accordance with some embodiments of the present disclosure.

FIG. 15 is a cross-sectional view illustrating an intermediate stage of forming a conductor block 120 in the formation of the semiconductor die structure 100, in accordance with some embodiments of the present disclosure. At the step S17 in the method 10 shown in FIG. 1, a second conductor block 120 is formed on the second supporting backbone 119. In some embodiments, similar to the fabrication processes described in FIGS. 6-9, the carbon hard mask 117 is removed (e.g., the carbon hard mask 117 is ashed away) and the conductor block 120 fills the regions between the spacer layer 105. The conductor block 120 may be a recessable material such as cobalt (Co), copper (Cu), ruthenium (Ru), or amorphous silicon (a-Si) (e.g., a-Si which is silicided later to form CoSi or NiSi).

In some embodiments, a planarization process such as a chemical mechanical polishing (CMP) process is performed to remove a portion of the conductor block 120, such that the spacer layer 105 is exposed. In some embodiments, after the planarization process, the conductor block 119 is embedded in the spacer layer 105, wherein the top end of the conductor block 120 is substantially the same as that of the spacer layer 105. In some embodiments, a recessing process such as an etching back process is then performed to remove a portion of the conductor block 120, wherein the top end of the conductor block 120 is substantially the same as that of the spacer layer 105.

In some embodiments, when the conductor block 120 is a-Si, metal may be deposited and annealed to form a metal silicide layer 120D over the conductor block 120. In some embodiments, metal nickel (Ni) may be deposited and annealed to form nickel silicide (NiSi) or metal cobalt (Co) may be deposited and annealed to form cobalt silicide (CoSi).

Figure 16:
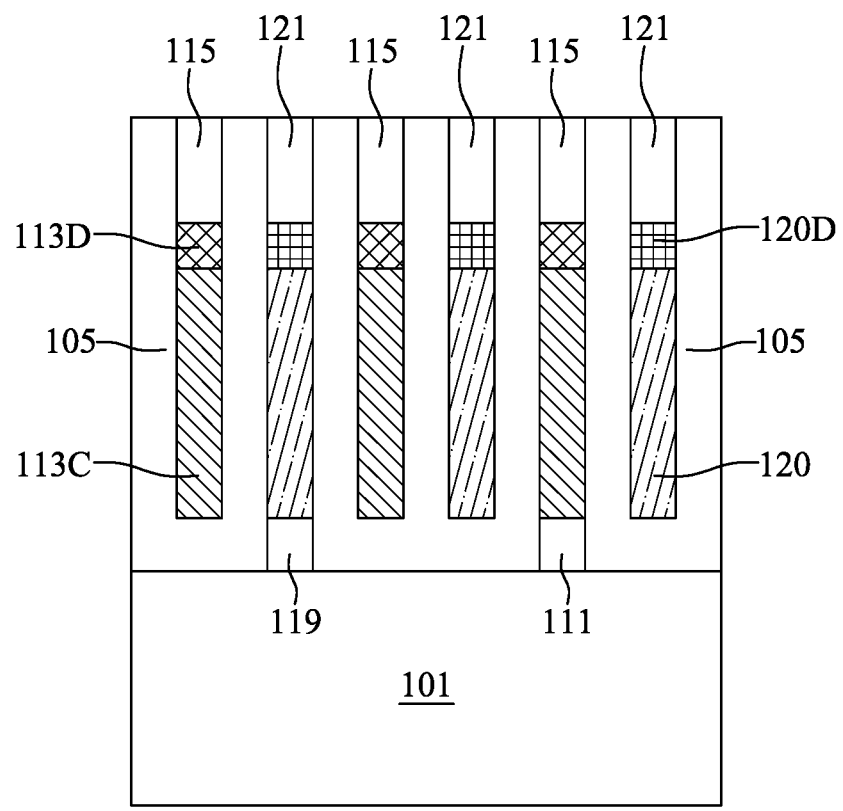
FIG. 16 is a cross-sectional view illustrating an intermediate stage of forming a second hard mask in the formation of the semiconductor die structure, in accordance with some embodiments of the present disclosure.

FIG. 16 is a cross-sectional view illustrating an intermediate stage of forming a second hard mask 121 in the formation of the semiconductor die structure 100, in accordance with some embodiments of the present disclosure. In some embodiments, a deposition process is performed to form the second hard mask 121 over the metal silicide layer 120D and a planarization process is then performed on the second hard mask 121. In some embodiments, the second hard mask 121 may include SiC, SiOC, ZrO2, HfO2, or W oxide. In some embodiments, the second hard mask 121 may be one or more of a dielectric, a carbide, or a metallic carbide. After forming the second hard mask 121, the conductor block 120 and the metal silicide layer 120 capped with the second hard mask 121 may be referred to as a metal line or a wire.

Figure 17:
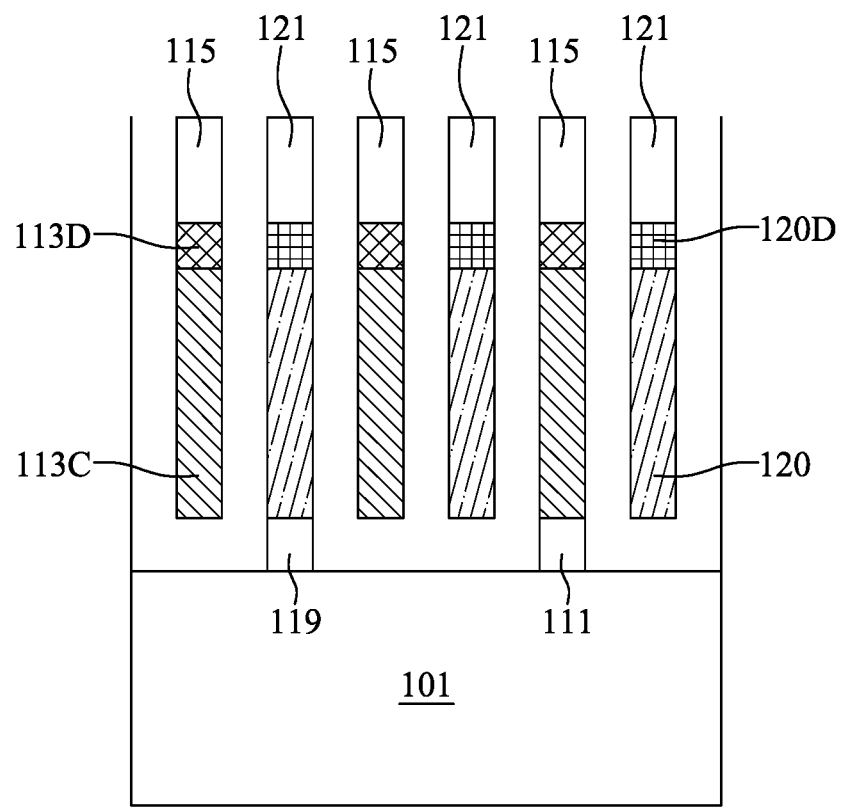
FIG. 17 is a cross-sectional view illustrating an intermediate stage of removing the spacer layer in the formation of the semiconductor die structure, in accordance with some embodiments of the present disclosure.

FIG. 17 is a cross-sectional view illustrating an intermediate stage of removing the spacer layer 105 in the formation of the semiconductor die structure 100, in accordance with some embodiments of the present disclosure. At the step S19 in the method 10 shown in FIG. 1, a plurality of suspended conductor blocks are formed over the substrate and connected to the first conductor block and the second conductor block. In some embodiments, the spacer layer 105 removed to expose the substrate 101. In some embodiments, hydrofluoric (HF) cleanse may be ran to remove the spacer layer 105, while the first supporting backbone 111 and the second supporting backbone 119 are not etched. A first set of the conductor block 113C and the conductor block 120 (e.g., metal lines, wires) are disposed on the first supporting backbone 111 and the second supporting backbone 119, while a second set of the conductor block 113C and the conductor block 120 (e.g., metal lines, wires) are suspended above the substrate 101 between the first supporting backbone 111 and the second supporting backbone 119.

Figure 18:
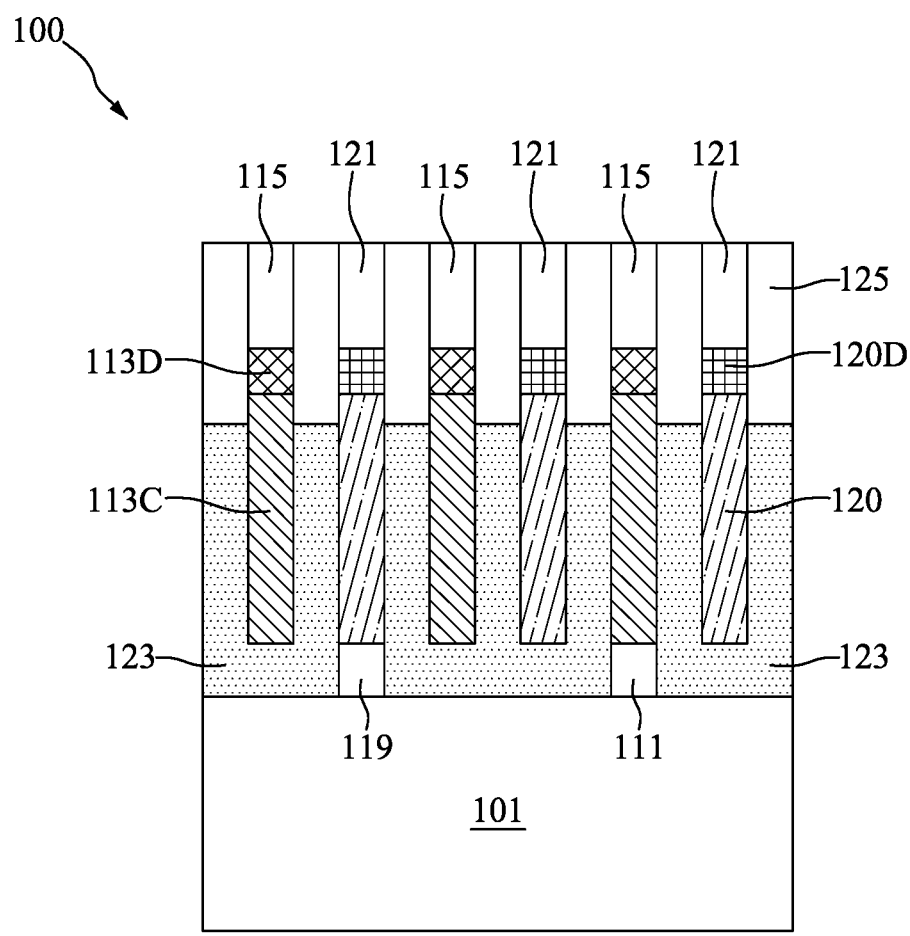
FIG. 18 is a cross-sectional view illustrating an intermediate stage of forming an energy removable layer and a capping dielectric layer in the formation of the semiconductor die structure, in accordance with some embodiments of the present disclosure.

FIG. 18 is a cross-sectional view illustrating an intermediate stage of forming an energy removable layer 123 and a capping dielectric layer 125 in the formation of the semiconductor die structure 100, in accordance with some embodiments of the present disclosure. At the step S21 in the method 10 shown in FIG. 1, an energy removable layer and a capping dielectric layer are sequentially formed over the substrate. In some embodiments, the energy removable layer 123 and the capping dielectric layer 125 are sequentially formed over the substrate 101, in accordance with some embodiments.

In some embodiments, the material of the energy removable layer 123 includes a thermal decomposable material. In some other embodiments, the material of the energy removable layer 123 includes a photonic decomposable material, an e-beam decomposable material, or another applicable energy decomposable material. Specifically, in some embodiments, the material of the energy removable layer 123 includes a base material and a decomposable porogen material that is substantially removed once being exposed to an energy source (e.g., heat).

In some embodiments, the base material includes hydrogen silsesquioxane (HSQ), methylsilsesquioxane (MSQ), porous polyarylether (PAE), porous SiLK, or porous silicon oxide (SiO2), and the decomposable porogen material includes a porogen organic compound, which can provide porosity to the space originally occupied by the energy removable layer 123 in the subsequent processes.

In addition, the capping dielectric layer 125 is made of silicon oxide, silicon nitride, silicon oxynitride, or multilayers thereof. In some embodiments, the capping dielectric layer 125 is made of a low-k dielectric material. In addition, the energy removable layer 123 and the capping dielectric layer 125 may be formed by deposition processes. In some embodiments, the deposition processes include chemical vapor deposition (CVD), physical vapor deposition (PVD), atomic layer deposition (ALD), spin-coating, or another applicable process.

Figure 19:
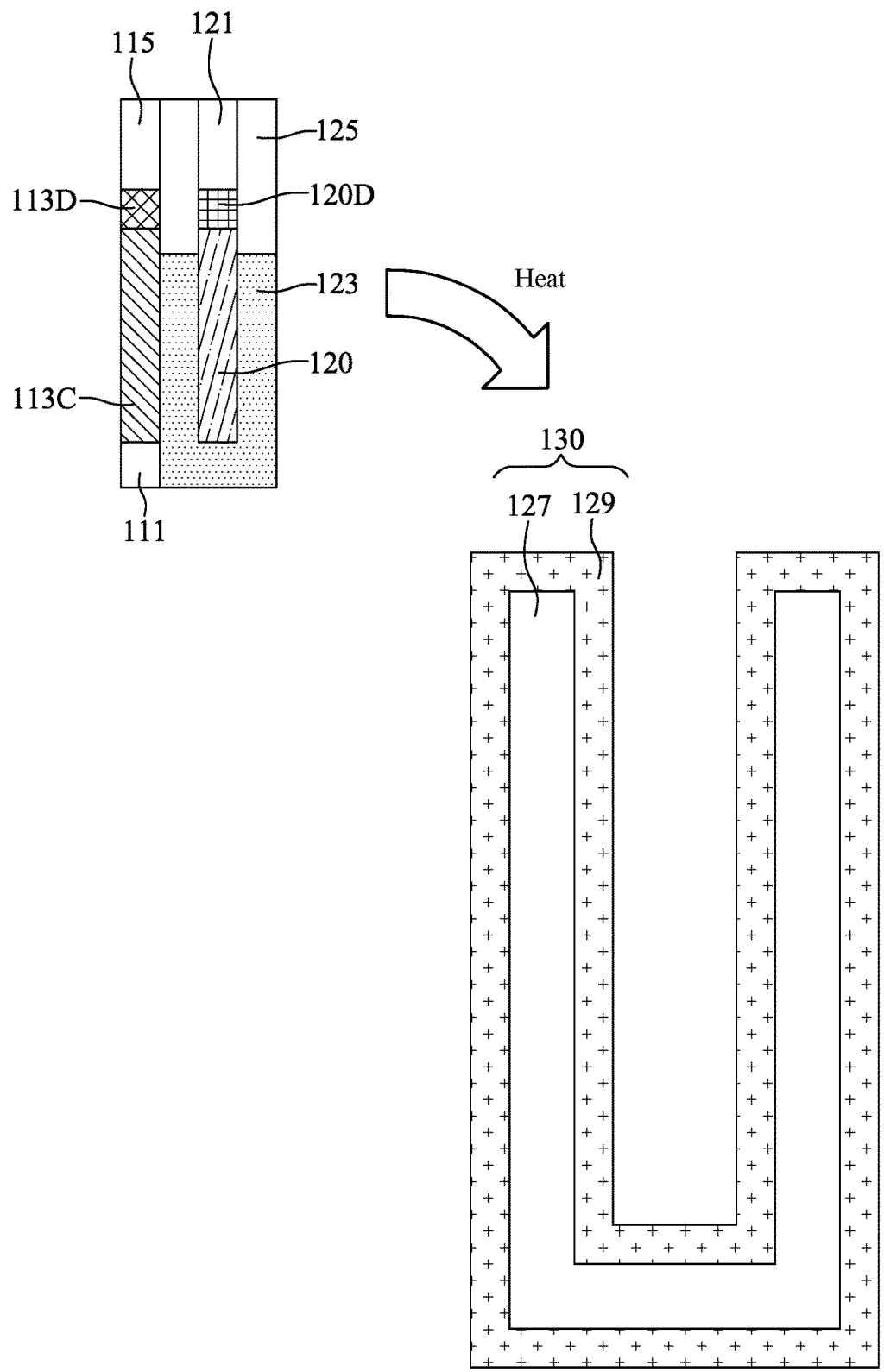
FIG. 19 is a cross-sectional view illustrating an intermediate stage of forming air gaps and liner layers in the formation of the semiconductor die structure, in accordance with some embodiments of the present disclosure.

FIG. 19 is a cross-sectional view illustrating an intermediate stage of forming air gaps 127 and liner layers 129 in the formation of the semiconductor die structure 100, in accordance with some embodiments of the present disclosure. At the step S23 in the method 10 shown in FIG. 1, a heat treatment process is performed to transform the energy removable layer into air gaps enclosed by liner layers. In some embodiments, a heat treatment process is performed to transform the energy removable layer 123 into an air gap structure 130 including an air gap 127 and a liner layer 129 enclosing the air gap 127. In some embodiments, the heat treatment process is used to remove the decomposable porogen materials of the energy removable layer 123 to generate pores, and the base materials of the energy removable layer 123 is accumulated at the edges of the energy removable layer 123 to form the liner layers 129. The pores are filled by air after the decomposable porogen materials are removed, such that the air gaps 127 are obtained inside the remaining portions of the energy removable layer 123. In some embodiments, the air gaps 127 may be a vacuum (e.g., pump out the gas in the air gaps). In some embodiments, the air gaps 127 may include an inert gas (e.g., nitrogen, helium, argon, air, etc.).

In some other embodiments, the heat treatment process can be replaced by a light treatment process, an e-beam treatment process, a combination thereof, or another applicable energy treatment process. For example, an ultra-violet (UV) light or laser light may be used to remove the decomposable porogen materials of the energy removable layer 123, and the air gaps 127 is then obtained.

Figure 20:
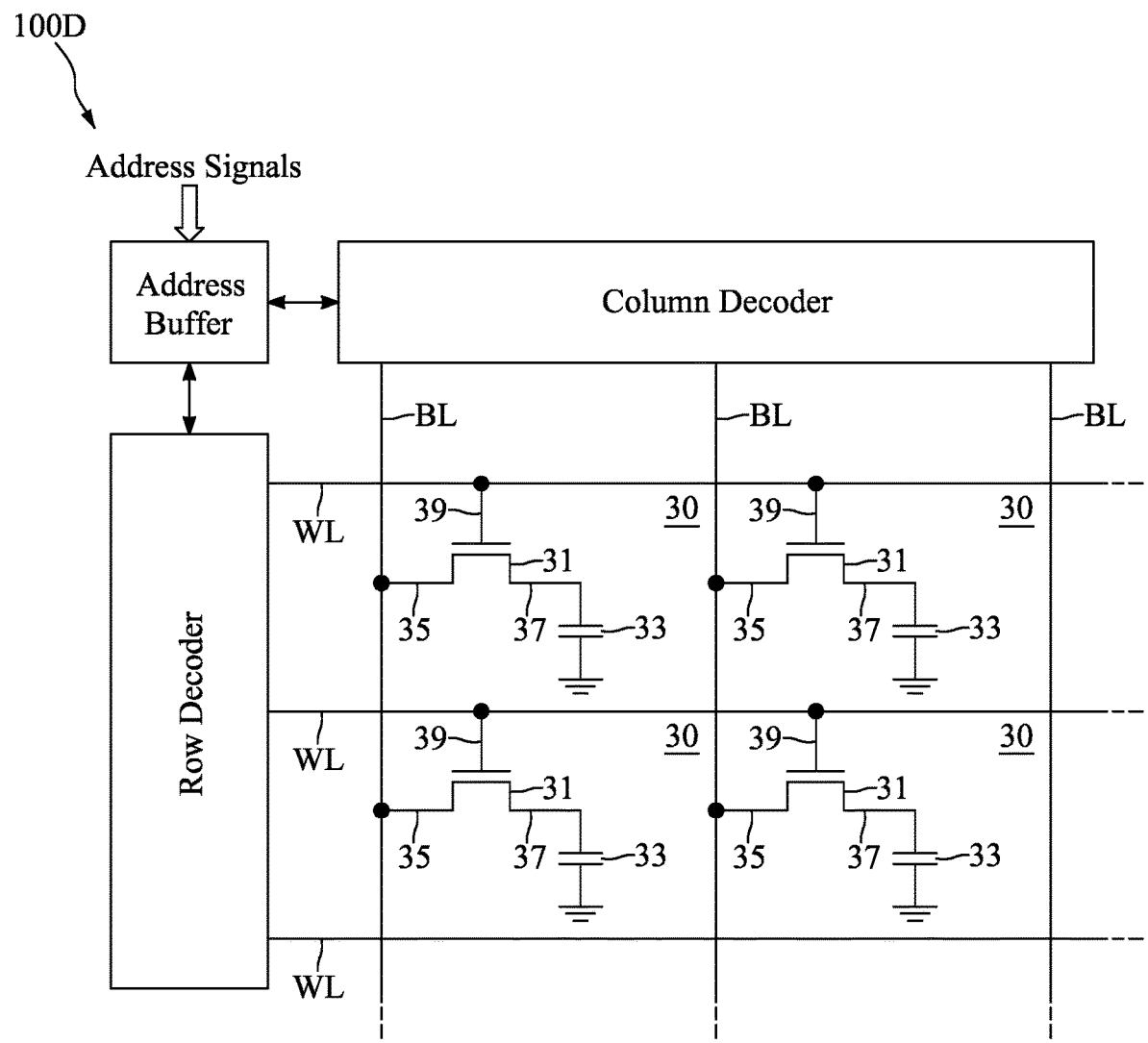
FIG. 20 is a schematic illustration of an exemplary integrated circuit, such as a memory device, including an array of memory cells in accordance with some embodiments.

FIG. 20 is a schematic illustration of an exemplary integrated circuit, such as a memory device 1000, including an array of memory cells 30 in accordance with some embodiments. In some embodiments, the memory device 1000 includes a dynamic random access memory (DRAM) device. In some embodiments, the memory device 1000 includes a number of memory cells 30 arranged in a grid pattern and including a number of rows and columns. The number of memory cells 30 may vary depending on system requirements and fabrication technology.

In some embodiments, each of the memory cells 30 includes an access device and a storage device. The access device is configured to provide controlled access to the storage device. In particular, the access device is a field effect transistor (FET) 31 and the storage device is a capacitor 33, in accordance with some embodiments. In each of the memory cells 30, the FET 31 includes a drain 35, a source 37 and a gate 39. One terminal of the capacitor 33 is electrically connected to the source 37 of the FET 31, and the other terminal of the capacitor 33 may be electrically connected to the ground. In addition, in each of the memory cells 30, the gate 39 of the FET 31 is electrically connected to a word line WL, and the drain 35 of the FET 31 is electrically connected to a bit line BL.

The above description mentions the terminal of the FET 31 electrically connected to the capacitor 33 is the source 37, and the terminal of the FET 31 electrically connected to the bit line BL is the drain 35. However, during read and write operations, the terminal of the FET 31 electrically connected to the capacitor 33 may be the drain, and the terminal of the FET 31 electrically connected to the bit line BL may be the source. That is, either terminal of the FET 31 could be a source or a drain depending on the manner in which the FET 31 is being controlled by the voltages applied to the source, the drain and the gate.

By controlling the voltage at the gate 39 via the word line WL, a voltage potential may be created across the FET 30 such that the electrical charge can flow from the drain 35 to the capacitor 33. Therefore, the electrical charge stored in the capacitor 33 may be interpreted as a binary data value in the memory cell 30. For example, a positive charge above a threshold voltage stored in the capacitor 33 may be interpreted as binary "1." If the charge in the capacitor 33 is below the threshold value, a binary value of "0" is said to be stored in the memory cell 30.

The bit lines BL are configured to read and write data to and from the memory cells 30. The word lines WL are configured to activate the field effect transistors (FET) 31 to access a particular row of the memory cells 30. Accordingly, the memory device 1000 also includes a periphery region which may include an address buffer, a row decoder and a column decoder. The row decoder and the column decoder selectively access the memory cells 30 in response to address signals that are provided to the address buffer during read, write and refresh operations. The address signals are typically provided by an external controller such as a microprocessor or another type of memory controller.

Referring back to FIG. 19, the air gaps 127 are formed in the cell region 300 (i.e., the pattern-dense region) of the semiconductor die structure 100, while no air gap is formed in the peripheral region 400 (i.e., the pattern-loose region) of the semiconductor die structure 100.

Embodiments of the semiconductor die structure 100 are provided in the disclosure. The semiconductor die structure 100 includes a plurality of air gaps 127, and the conductor block 113C and the conductor block 120 are separated from the each other by the air gaps 127. Therefore, the parasitic capacitance between the conductive contacts may be reduced. As a result, the overall device performance may be improved (i.e., the decreased power consumption and resistive-capacitive (RC) delay), and the yield rate of the semiconductor device may be increased.

One aspect of the present disclosure provides a semiconductor die structure, comprising: a substrate; a first supporting backbone disposed on the substrate; a second supporting backbone disposed on the substrate; a first conductor block disposed on the first supporting backbone; a second conductor block disposed on the second supporting backbone; a third conductor block disposed above the substrate and connected to the first conductor block and the second conductor block; and an air gap structure disposed between the first conductor block, the second conductor block, and the third conductor block, wherein the air gap structure comprises an air gap and a liner layer enclosing the air gap.

Another aspect of the present disclosure provides a semiconductor die structure, comprising: a substrate including a first site and a second site; a first conductor block disposed on the first site; a second conductor block disposed on the second site; a third conductor block disposed above the substrate and connected to the first conductor block and the second conductor block; an air gap structure disposed between the first conductor block, the second conductor block, and the third conductor block, wherein the air gap structure comprises an air gap and a liner layer enclosing the air gap.

Another aspect of the present disclosure provides a method for preparing a semiconductor die structure, comprising: forming a first supporting backbone on the substrate; forming a first conductor block on the first supporting backbone; forming a second supporting backbone on the substrate; forming a second conductor block on the second supporting backbone; forming a third conductor block suspended above the substrate and connected to the first conductor block and the second conductor block; sequentially forming an energy removable layer and a capping dielectric layer over the substrate, and the energy removable layer and the capping dielectric layer separating the first conductor block, the second conductor block and the third conductor block; and performing a heat treatment process to transform the energy removable layer into a plurality of air gap structures, wherein at least one of the air gap structures comprises an air gap and a liner layer enclosing the air gap.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for preparing a semiconductor die structure, comprising:
    forming a first supporting backbone on the substrate;
    forming a first conductor block on the first supporting backbone;
    forming a second supporting backbone on the substrate;
    forming a second conductor block on the second supporting backbone;
    forming a third conductor block suspended above the substrate and connected to the first conductor block;
    sequentially forming an energy removable layer and a capping dielectric layer over the substrate, and the energy removable layer and the capping dielectric layer separating the first conductor block, the second conductor block and the third conductor block; and
    performing a heat treatment process to transform the energy removable layer into a plurality of air gap structures, wherein at least one of the air gap structures comprises an air gap and a liner layer enclosing the air gap.

2. The method of claim 1, wherein the forming of the first supporting backbone on the substrate comprises:
    forming a plurality of silicon-containing lines on the substrate;
    depositing a spacer layer on the substrate and the plurality of silicon-containing lines; and
    removing a first portion of the spacer layer to expose a first portion of the substrate between the plurality of polysilicon lines.

3. The method of claim 1, wherein the forming of the first conductor block on the first supporting backbone comprises forming a metal capped with a first hard mask between the plurality of silicon-containing lines.

4. The method of claim 3, wherein the forming of the second supporting backbone comprises:
    removing the plurality of polysilicon lines;
    forming the spacer layer on the substrate; and
    removing a second portion of the spacer layer to expose a second portion of the substrate.

5. The method of claim 4, wherein the forming of the second conductor block on the second supporting backbone comprises forming the metal capped with a second hard mask.

6. The method of claim 5, wherein the forming of the third conductor block above the substrate further comprises removing the spacer layer.

* * * * *